United States Patent [19]

Quine

[11] 4,291,278
[45] Sep. 22, 1981

[54] PLANAR MICROWAVE INTEGRATED CIRCUIT POWER COMBINER

[75] Inventor: John P. Quine, Schenectady, N.Y.

[73] Assignee: General Electric Company, Schenectady, N.Y.

[21] Appl. No.: 148,790

[22] Filed: May 12, 1980

[51] Int. Cl.³ .................. H03F 3/60; H03F 3/68; H01P 1/16; H01P 1/162
[52] U.S. Cl. ..................... 330/286; 333/26; 333/128; 333/246; 333/251
[58] Field of Search ............... 330/124 R, 295, 286; 333/26, 33, 34, 128, 136, 137, 238, 246, 247, 251

[56] References Cited

U.S. PATENT DOCUMENTS

| | | | |
|---|---|---|---|
| 3,390,333 | 6/1968 | Klawsnik et al. | 330/124 R X |
| 3,593,174 | 7/1971 | White | 330/124 R X |
| 4,052,683 | 10/1977 | van Heuven et al. | 333/26 X |
| 4,157,516 | 6/1979 | van de Grijp | 333/26 |

OTHER PUBLICATIONS van Heuven, *A New Integrated Waveguide-Microstrip Transition,* IEEE Trans. on MTT, Mar. 1976, pp. 144-147.

*Primary Examiner*—Paul L. Gensler
*Attorney, Agent, or Firm*—Donald R. Campbell; James C. Davis; Marvin Snyder

[57] ABSTRACT

A broadband, low loss, microwave integrated circuit power combiner for field effect transistors and other solid state amplifiers has a single metallized MIC substrate contained within a waveguide structure. An array of fin-line transitions from plural microstrip lines to a standard output waveguide can be tapered and placed directly in the waveguide taper region. Undesired higher order modes are absorbed by resistance metallization strips at the tips of the fin-lines or by resistor networks which bridge the microstrip lines.

16 Claims, 9 Drawing Figures

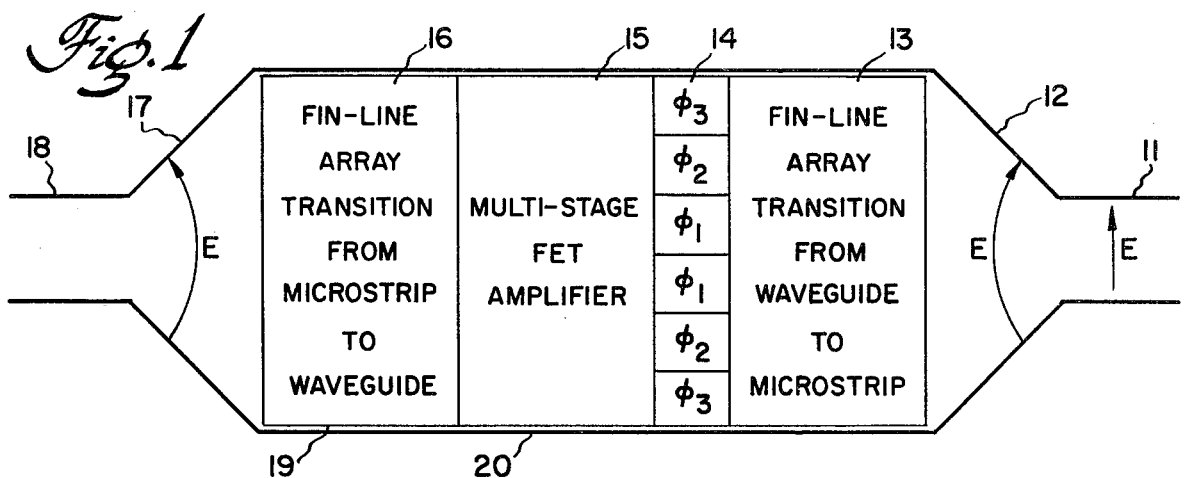
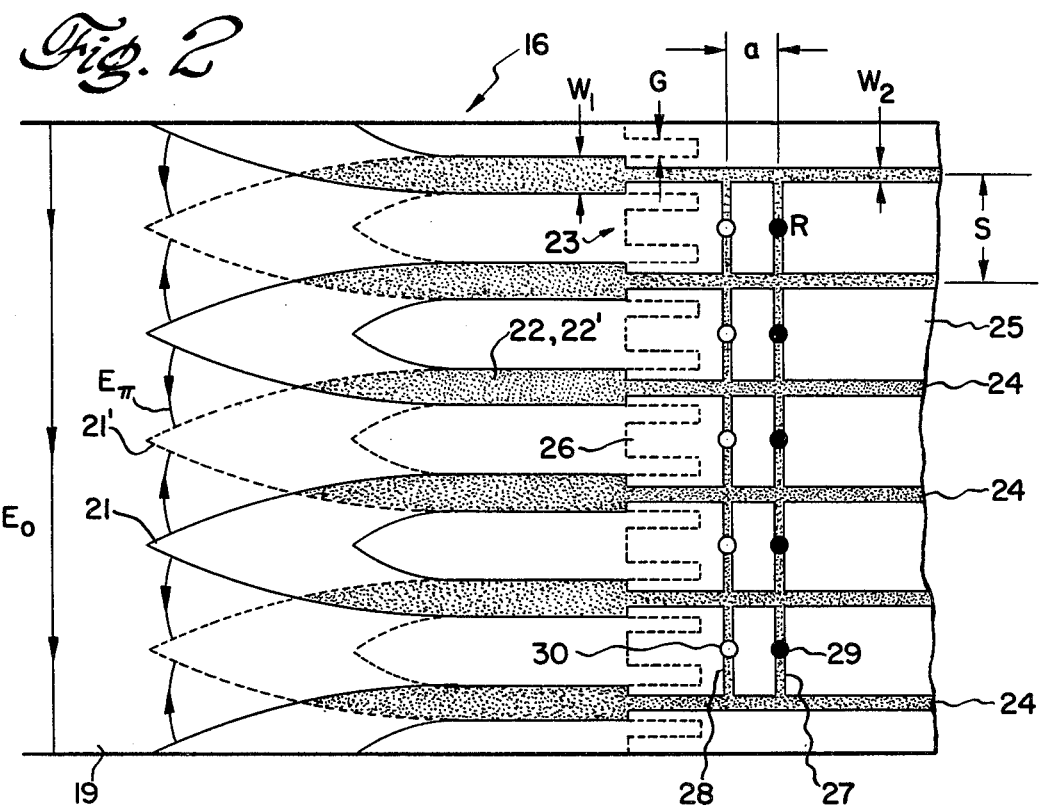
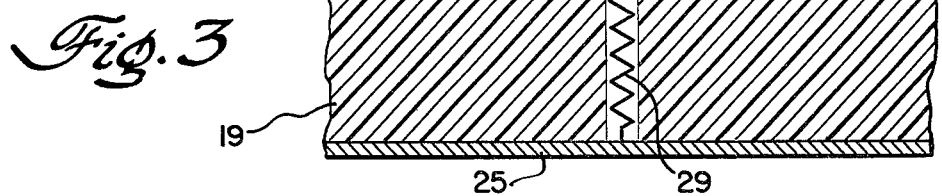

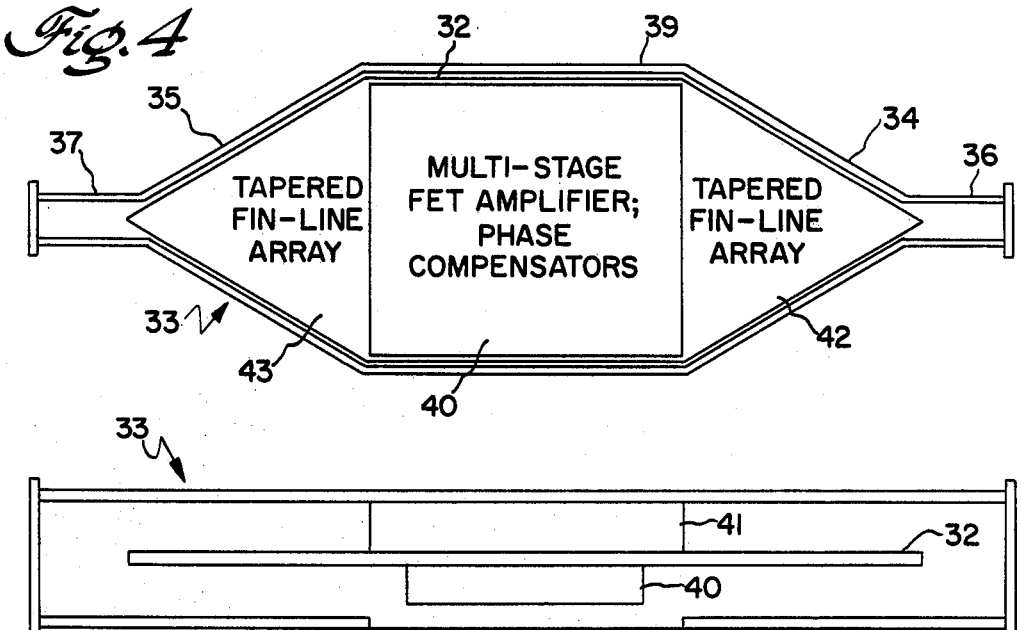
Fig. 4
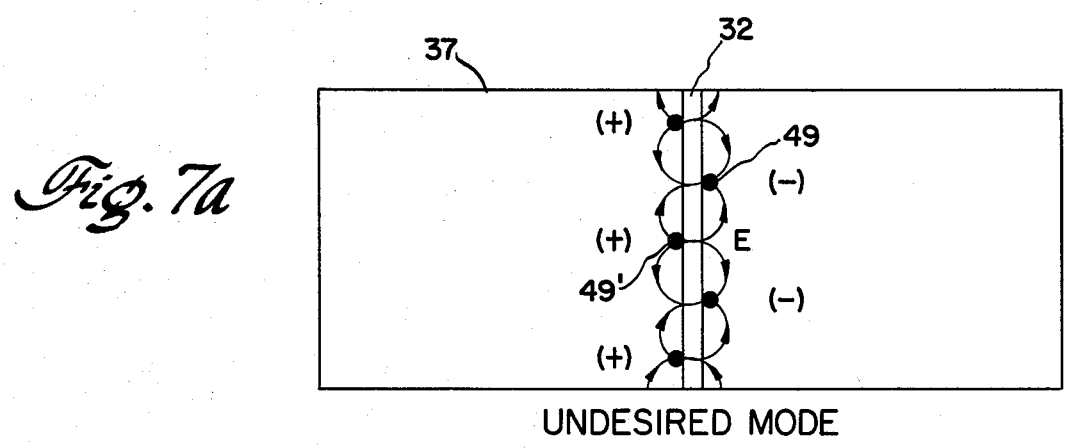
Fig. 5
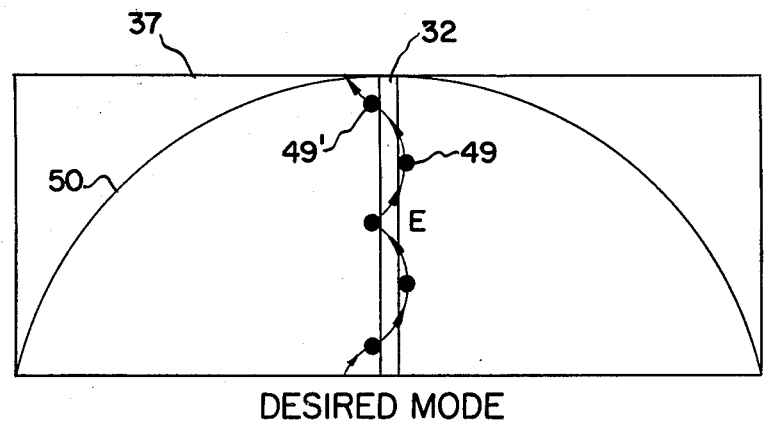
Fig. 7a
UNDESIRED MODE
Fig. 7b
DESIRED MODE

PLANAR MICROWAVE INTEGRATED CIRCUIT POWER COMBINER

BACKGROUND OF THE INVENTION

This invention relates to microwave power combiners using solid state amplifier devices and to planar transitions from waveguide to microstrip or vice versa.

Combining the power from several FET amplifiers is a current approach for obtaining higher power microwave solid state power sources. The combining efficiency must be increased and the fabrication costs must be reduced to make this approach competitive with conventional vacuum tube power sources such as traveling-wave tubes. The successful solution will simultaneously satisfy all the important requirements of low cost, high combining efficiency and broad bandwidth, and does not use coaxial connectors.

A fin-line transition from waveguide to microstrip is inherently low loss. A single transition in a single waveguide is described in J. H. C. van Heuven, IEEE Transactions on Microwave Theory and Techniques, Vol. MTT-24, No. 3, March 1976, pp. 144–147.

SUMMARY OF THE INVENTION

A single substrate microwave integrated circuit (MIC) power combiner for field effect transistor and other amplifiers is contained within a waveguide structure. Because no coaxial-line connectors are employed, high combining efficiency and low fabrication cost can result. The dielectric substrate has metallization patterns on both sides which include an array of fin-line transitions from a plurality of microstrip lines to waveguide. Power absorbers are provided for absorbing undesired higher order combiner modes.

A first configuration of the array of fin-line transitions is nontapered. The preferred embodiment, however, is a tapered fin-line array which achieves a significant reduction in size and is placed directly in an E plane waveguide taper region. One substrate metallization pattern has tapered fin-lines, each half of which transitions to an unbalanced microstrip line with a given characteristic impedance; the other pattern has staggered fin-lines which transition to a serrated choke section and hence to a continuous ground plane. High resistance metallization strips extending from the tips of the tapered fin-lines absorb undesired combiner modes. Alternatively, there are planar resistor networks which bridge every adjacent pair of unbalanced microstrip lines. The FET amplifier array is attached to the substrate in an oversized waveguide region, and on the opposite side of the substrate a device heat sink is attached to the ground plate. An input tapered fin-line array transition from waveguide to microstrip divides the microwave power equally among the FET devices.

Various space communications and radar applications are foreseen, such as an X-band TWT (traveling-wave tube) replacement.

BRIEF DESCRIPTION OF THE DRAWINGS

FIG. 1 is a schematic system diagram of the microwave integrated circuit field effect transistor amplifier array power combiner;

FIG. 2 shows the array of fin-line transitions from N microstrip amplifier lines to a single standard output waveguide;

FIG. 3 is a partial cross section through the metallized substrate showing one of the feed-through resistors in FIG. 2;

FIGS. 4 and 5 are side and top views, the latter with the top walls removed to reveal interior detail, of the preferred embodiment of the power combiner system;

FIGS. 7a and 7b are diagrams to an enlarged scale of the substrate and fin-line extensions and of the electric field distributions for undesired and desired combiner modes at the waveguide port.

DESCRIPTION OF THE PREFERRED EMBODIMENTS

Figure 6:
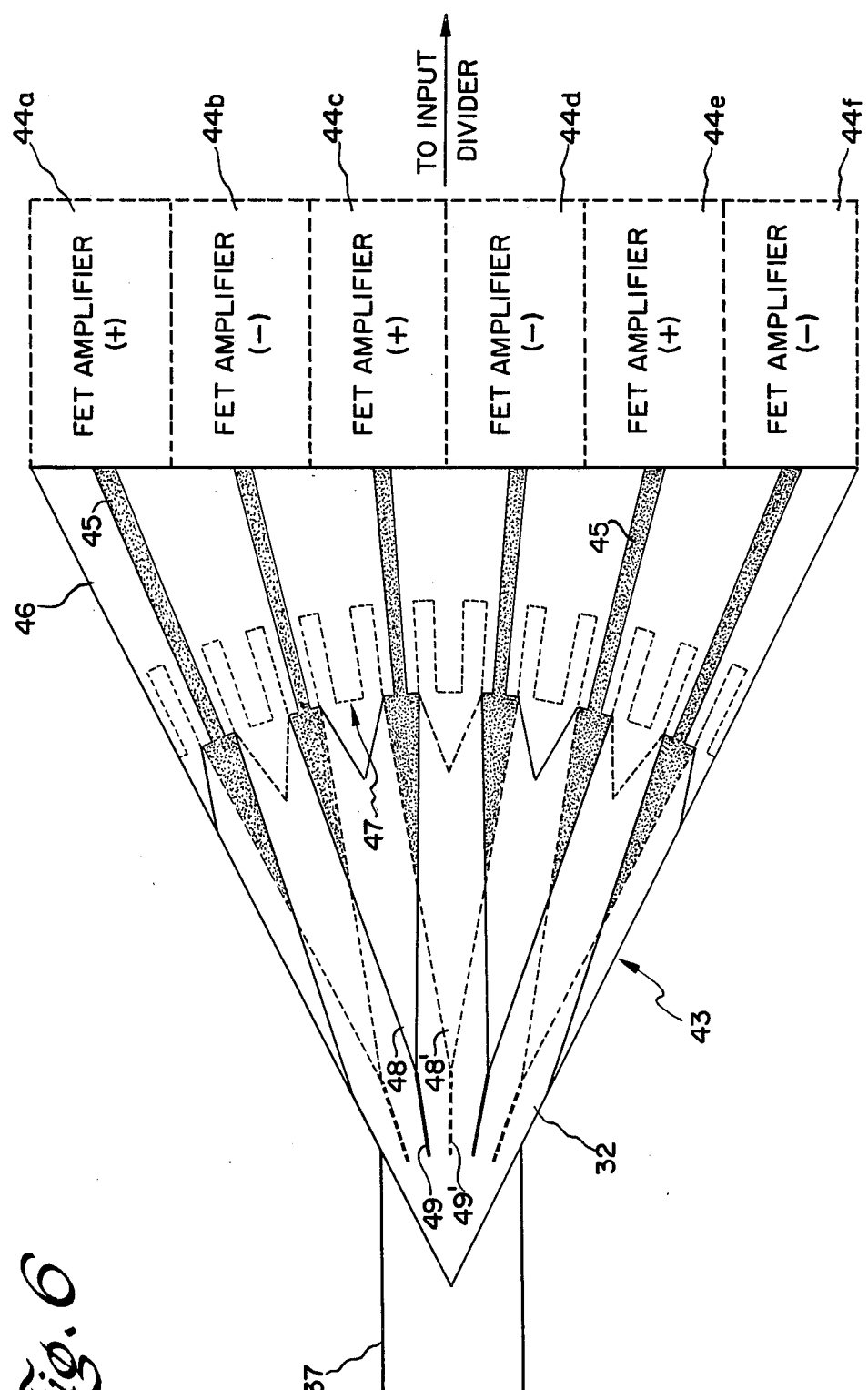
FIG. 6 is a plan view of the tapered fin-line array and FET amplifiers employed in FIG. 4.

An overall view of the first configuration of the microwave power amplifier or power combiner is given in FIG. 1. A standard conventional input rectangular waveguide 11, in which the E vector is oriented parallel to the side walls and has a sinusoidal amplitude distribution, launches a cylindrical wave in an E plane waveguide taper 12. An array of waveguide-microstrip fin-line transitions 13 divides the microwave power equally among two or more microstrip lines. Assuming that there are several such lines, the power in adjacent lines is out of phase by 180°. Phase compensators 14 are provided in order to compensate for phase differences produced by both the input and output tapers, and are placed only on the input side in order not to contribute any loss on the high power output side of the FET amplifiers. Several known configurations for the phase compensators can provide the required characteristics. The multi-stage FET amplifier 15 is fabricated in microwave integrated circuit form on a dielectric substrate and is a conventional component which will not be further described. An array of microstrip-waveguide fin-line transitions 16 combines the power from plural microstrip lines (six in the example given). Fin-line arrays 13 and 16 may be identical to one another except that they face in opposite directions. Further E plane waveguide taper 17 feeds the amplified microwave power to a standard conventional rectangular output waveguide 18. Input fin-line divider array 13, phase compensators 14, FET amplifiers 15, and fin-line combiner array 16 can be all on a single metallized MIC dielectric substrate 19, such as quartz or alumina, contained within the oversize waveguide region 20. The FET amplifiers and phase compensators can be separate modules attached to the printed circuit substrate.

An illustrative example of the practice of the invention is that input and output waveguides 11 and 18 are X-band (8–12.5 GHz) guide which has a height of 0.497 inch and a width of 1.122 inches. The length of E plane tapers 12 and 17 is 3 inches or less, and the height of the oversized guide region is 3 inches. If there are six FET amplifier devices, the spacing S (see FIG. 2) between microstrip lines is 0.5 inch. The input side of fin-line divider array 13 is illuminated with an amplitude distribution that is essentially constant. Under the assumed conditions, the phase distribution of the input excitation is $\phi_1=0°$, $\phi_2=18.74°$ and $\phi_3=54.8°$. Phase compensators 14 have values twice these amounts in order to compensate for both the input and output taper phase differences. Thus, for the above typical conditions, $\phi_1=0°$, $\phi_2=37.4°$, and $\phi_3=109.6°$. It may be possible to make the microstrip line spacing S as small as 0.25 inch.

In fact, FET MIC circuits in vendor literature show overall widths less than 0.25 inch for a frequency of 7 GHz. The throats of the two relatively wide angle tapers can be made to have very broadband values of voltage standing wave ratio by simple inductive iris compensation.

FIG. 2 shows the layout of the array of fin-line transitions 16 from microstrip to waveguide. In this figure and also FIGS. 6 and 8, the metallization pattern on the top side of the dielectric substrate is depicted in full lines, the metallization pattern on the bottom surface in dashed lines, and pattern areas on both sides are shown speckled. The substrate can be silica (quartz) and the conductor metallizations are gold. A plurality of fin-lines 21 and 21' are printed on the top and bottom surfaces of substrate 19 and transition to balanced microstrip lines 22 and 22' of width $W_1$. The number of complete top surface fin-lines 21 (three) is equal to the number of bottom surface fin-lines 21' (three), but those on the bottom surface are staggered with respect to those of the top surface. Each half of a fin-line transitions to one of the balanced microstrip lines 22 or 22'. Serrated choke balanced-to-unbalanced transformers 23 with gaps G are used to transition from balanced microstrip to unbalanced microstrip, the latter having conductors 24 with a width $W_2$ on the top side of the substrate only and a continuous metallized ground plane 25 on the bottom surface. Unbalanced microstrip lines 24 have a given characteristic impedance such as 50 ohms and each connects to the output of a FET amplifier. Adjacent amplifier devices are out of phase by 180° (see FIG. 6). Assuming for the moment that the direction of wave energy propagation is from left to right (as in fin-line divider array 13), the advancing E field clings to the tapering fin-lines 21 and 21' on the opposite sides of substrate 19, concentrating and rotating the electric field through 90° which becomes confined to the space btween balanced lines 22 and 22'. Serrated choke section 23 is divided by the gaps into longitudinally extending approximately quarter wavelength stubs 26 which have short circuits on the ends. The stubs force the current to flow longitudinally and are an open circuit for transverse currents. These serrated choke balanced to unbalanced microstrip transitions are conventional structures. Propagation through the oversized waveguide, except along unbalanced microstrip lines 24, is prevented by the ground plane 25 which divides the guide into parallel guides.

The desired combiner mode has the uniform field $E_o$ as shown. A study of the transition shows that this field excites adjacent unbalanced microstrip lines 24 with 180° phase differences. Similarly, the fields $E_\pi$ associated with the highest order of combiner mode (undesired $\pi$-mode) are nonuniform as shown, and excite adjacent unbalanced microstrip lines 24 with zero phase difference. Therefore, in order to provide absorption for the $\pi$-mode (adjacent FET amplifiers are in phase), adjacent 50 ohm unbalanced microstrip lines 24 are bridged with two sets of microstrip lines 27 and 28 having character impedances of 100 ohms. The set of lines 27 nearest the FET amplifiers have feed-through resistors 29 (see also FIG. 3) at their exact midpoints which connect at the other end with ground plane 25. Similarly, the second set of bridging lines 28 furtherest from the FET amplifiers have short circuits between exact center points and the ground plane. That is, there is a hole 30 at the midpoint. These networks absorb the undesired higher order combiner modes.

Since the desired mode has adjacent microstrip lines 24 180° out of phase, the exact center point of the bridging lines is a voltage null. Since the voltage at the center is zero, no power in the desired mode is dissipated in shunt resistor 29. In this case, the two bridging lines 27 and 28 appear as short circuited stub lines, and if the spacing S between unbalanced lines 24 is about one-half microstrip wavelength, the shunting reactance is very high. The net shunting reactance is further reduced by making the spacing "a" between the two bridging lines 27 and 28 equal to about one-quarter microstrip wavelength. On the other hand, the undesired $\pi$-mode of the combiner having adjacent FET amplifiers in phase is match-terminated by shunt resistors 29 under the above conditions. If adjacent lines 24 are in phase (refer to FIG. 3), there is voltage at the exact center point of bridging line 27 and power is absorbed by resistor 29. The purpose for the short circuited bridging lines 28 is now clear. These are needed to "stabilize" the impedance presented to the undesired $\pi$-mode. This can be understood by noting that the $\pi$-mode impedance looking out towards the fin-lines 21 and 21' is uncertain, being highly frequency-dependent as a result of the relatively long length between feed-through resistors 29 and the fin-line transitions. Note that the $\pi$-mode excites a discrete spectrum of modes in the waveguide taper.

Higher order propagating modes are only weakly excited in the bigger size waveguide 20 and fin-lines 21 and 21' by the desired combiner mode because the dimensions of the waveguide and printed substrate can be held to close tolerances. Microstrip dissipation and leakage past short-circuited bridging lines 28 may be sufficient to dampen these modes. If not, other simple means such as a transverse slot in the taper can be employed.

This MIC power combiner configurations has the following important advantages. The single-substrate fabrication leads to low cost. No coaxial connectors are employed, and therefore reliable, low loss power combining can be achieved. A fin-line transition is inherently low loss. The array of fin-line transitions set forth here may have even less dissipation loss than the single transition described by J. H. C. van Heuven (citation given previously). This configuration is ideal for good heat sinking of the FET amplifiers. Since the electric field is effectively rotated by 90° by the fin-line transitions, the FET amplifier ground plane can be parallel to the side wall of the input and output waveguides (see FIG. 5). A match for the undesired $\pi$-mode of the combiner is realized employing the shunt resistor and shunt circuit short, and can provide high isolation between FET amplifier ports.

The preferred embodiment of the broadband low loss transition from N microstrip amplifier lines to a single standard output waveguide is illustrated in FIGS. 4–8. A very significant reduction in size is obtained by employing a tapered fin-line array which is placed directly in the waveguide taper region. Furthermore, the means for absorbing higher order combiner modes can be completely planar and can be fully printed, thus eliminating the need for feed-through resistors 29 employed in FIGS. 2 and 3.

Planar substrate 32, FIGS. 4–6, is mounted centrally within waveguide structure 33. The two ends of substrate 32 are oppositely tapered to conform to the dimensions of E plane waveguide tapers 34 and 35 and the tips may extend into input and output rectangular waveguides 36 and 37. A door 38 is placed in one side wall of oversize waveguide region 39 to permit access to a multi-stage FET amplifier module 40 which may include the phase compensators and is attached to one side of substrate 32. A heat sink 41 is attached to the ground plane on the other side of the substrate. As before, tapered fin-line divider array 42 equally divides the microwave energy propagating from input waveguide 36 among the N microstrip lines. After being amplified by the FET devices, the power on N microstrip output lines is combined by an array of tapered fin-line transitions 43 and is fed into output waveguide 37.

The six high, power FET amplifiers 44a–44f, FIG. 6, have outputs that for adjacent devices are 180° out of phase. The output of each is connected to 50 ohm unbalanced microstrip lines 45. On the opposite surface of dielectric substrate 32 is a continuous metallized ground plane 46. A serrated choke unbalanced-to-balanced transformer 47 serves as a transition from unbalanced-to-balanced microstrip. The length of balanced microstrip line is considerably less than in FIG. 2 and may even approach zero. Every adjacent pair of microstrip lines 45 transitions to a tapered fin-line 48 (three complete fin-lines on the top surface) and on the bottom surface the transition is to three staggered tapered fin-lines 48'. Microwave energy propagating along microstrip lines 45 is rotated through 90° by fin-lines 48 and 48' and becomes a cylindrical wave.

For many applications an alumina substrate 32, rather than fused silica ($SiO_2$), is optimum. If the FET amplifiers are fabricated on alumina ($Al_2O_3$) substrates, then the interface with the fin-line combiner arrays is simplified. Furthermore, the relatively large size of this combiner substrates raises questions of reliability, if made of fused silica, because of the possibilty of severe mechanical stresses. An additional long term consideration is that eventually it may be possible to develop FET amplifiers with sufficient uniformity to permit the metallization for the amplifier input and output tuning circuits to be printed on the same substrate containing the combiner metallizations. In this case, only two beam lead connections would be required to connect each FET device to the input and output substrates.

However, the use of $Al_2O_3$ introduced problems because the high dielectric constant of 9.9 leads to a significantly shorter wavelength than for $SiO_2$ which has a dielectric constant equal to 3.78. The shorter wavelength leads to reduced frequency bandwidth and perhaps to an increse in the small unwanted dissipation experienced in the networks containing the higher order mode absorbing resistors (29, FIG. 3).

A new concept for absorbing the high order combiner modes is depicted in FIG. 6. The undesired modes can be absorbed effectively by extending the tips of the tapered fin-lines 48 and 48' with high resistivity metallization strips 49 and 49'. Analysis has shown that the high resistance strips 49, 49' which form extensions to the fin-line array can selectively absorb the higher order combiner modes with only negligible loss experienced by the desired combiner mode. FIGS. 7a and 7b show the basis for this conclusion. These are exaggerated schematics showing output waveguide 37 and alumina substrate 32 with the five fin-line extensions 49 and 49'. This respresents the region near the junction between tapered waveguide 35 and untapered waveguide 37.

FIG. 7a depicts the electric field distributions for the highest order combiner mode, i.e., the undesired mode. For this mode all microstrip output lines 45 have the same phase. As a result, there is a net charge on each of the fin-line tips and this charge has opposite sign on adjacent tips. Thus, the higher order combiner modes excite quasi-TEM modes on the fin-lines which are tightly bound to the fin-lines with very high current densities. The higher order modes requires the fins in order to propagate and are completely reflected at the ends of the fins. Therefore, these modes can be very effectively and gradually absorbed by extending the fin metallization with high resistivity metallizations 49 and 49'. In principle, it is possible to obtain a broadband termination of all high order combiner modes in this way. Under these conditions, the combiner would have good isolation characteristics.

On the other hand, referring to FIG. 7b, the desired combiner mode is only very loosely coupled to the fins near the tips of the fins. Note that the desired mode has 180° phase differences between adjacent microstrip lines, and that there is no net charge on any of the fins, the charge distribution having a dipolar form. At the end of the fins the desired mode has transitioned to the $TE_{10}$ waveguide mode which has power density spread out over the entire waveguide cross section in the sine-square distribution (indicated at 50).

Another approach is to employed lumped resistors (i.e., discrete elements) at the tips of fin-lines 48 and 48' which are followed by gold or other high conductivity strips. The gold strips are made about one quarter wavelength long in order to provide a low reactance in series with the resistors to permit strong current flow in the resistors. This second approach may have somewhat less than ideal isolation characteristics. However, it may not require as low a value of resistivity for the absorber metallization, and therefore has an advantage over the first approach which employs distributed absorbers.

Figure 8:
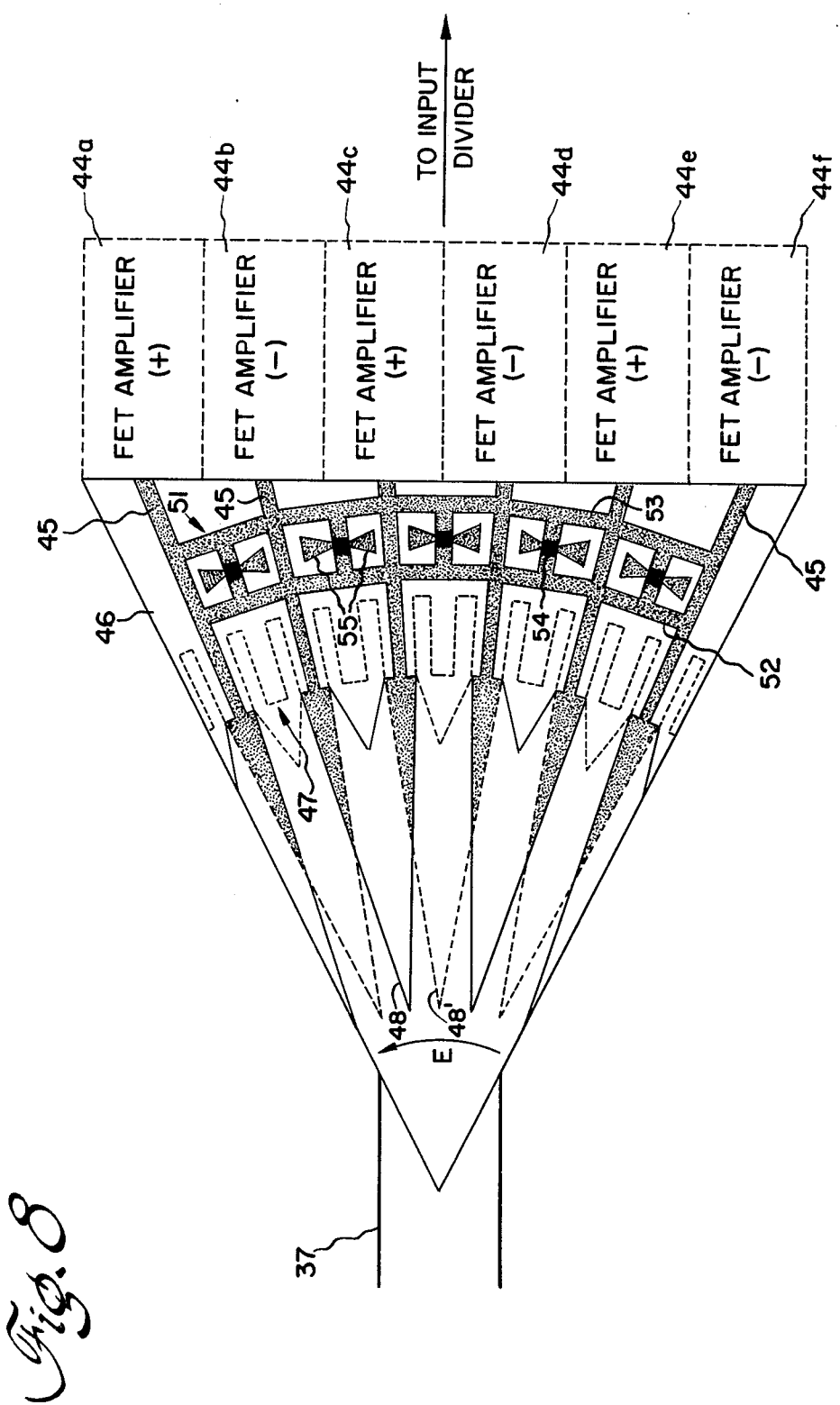
FIG. 8 shows a tapered fin-line array with a planar resistor power absorber network.

FIG. 8 shows the planar MIC power combiner employing a tapered fin-line array and is identical to FIG. 6 except that the substrate is fused silica rather than alumina, and high resistivity metallizations 49 and 49' are not employed and other planar resistor networks indicated generally at 51 absorb the higher order combiner modes. These resistor networks 51 are completely planar and can be fully printed. A total of view are needed in FIG. 8, one network between each pair of microstrip lines 45. The metallization pattern to provide each such network has a pair of transversely extending, parallel bridging lines 52 and 53 at the midpoint of which are extensions which connect to a printed resistor 54. A pair of quarter wave open lines 55 provide a path for the resistor current. For the desired combiner mode, adjacent unbalanced microstrip lines 45 are 180° out of phase and there are voltage nulls at the midpoints of bridging lines 52 and 53 so that now power is absorbed by planar resistor 54. For the undesired combiner mode, adjacent microstrip lines 45 are in phase and there is a finite voltage at the midpoints of bridging lines 52 and 53 so that power is absorbed by resistor 54.

The solid state amplifier device can also be a microwave frequency transitor, and since this like the field effect transistor is a transmission type device, an input power divider array of fin-line transitions is used. A configuration for a reflection type solid state amplifier such as an IMPATT diode requires only one array of fin-line transitions which is alternately a power divider from waveguide to microstrip and a power combiner from microstrip to waveguide.

Various applications for the broadband, low loss, low cost planar microwave integrated circuit power combiners or power applifiers are foreseen in both space communications and radar. One application is an X-band TWT (traveling-wave tube) replacement.

While the invention has been particularly shown and described with reference to preferred embodiments thereof, it will be understood by those skilled in the art that various changes in form and details may be made therein without departing from the spirit and scope of the invention.

The invention claimed is:

1. A microwave power combiner comprising:
a dielectric substrate having metallization patterns on both sides which form an array of fin-line transitions from microstrip to waveguide, said patterns having plural microstrip lines with a given characteristic impedance and an opposing continuous ground plane which transition to an unbalanced-to-balanced transformer and hence to plural fin-lines arranged such that the fin-lines on one substrate surface are staggered relative those on the other surface; and
a plurality of microwave solid state amplifiers mounted on said dielectric substrate, each of which is connected to one of said microstrip lines;
said array of fin-line transitions and attached solid state amplifiers being contained within a waveguide structure.

2. The power combiner of claim 1 wherein said array of fin-line transitions further has power absorber means for absorbing undesired higher order combiner modes.

3. The power combiner of claim 2 wherein said solid state amplifiers are field effect transistors, and a heat sink attached to said ground plane.

4. The power combiner of claim 2 wherein said metallization patterns further include balanced microstrip lines that transition to said fin-lines, and wherein said unbalanced-to-balanced transformer is a serrated choke which transitions from said balanced microstrip lines to the previously mentioned microstrip lines which are unbalanced.

5. The power combiner of claim 4 wherein said power absorber means is comprised of networks with feed-through resistors which bridge every adjacent pair of unbalanced microstrip lines.

6. The power combiner of claim 2 wherein said array of fin-line transitions and all individual fin-lines are tapered so as to fit within an E plane waveguide taper region of said waveguide structure.

7. The power combiner of claim 6 wherein said power absorber means comprises resistance means at the tips of said tapered fin-lines.

8. The power combiner of claim 6 wherein said power absorber means comprises high resistance metallization strips extending from the tips of said tapered fin-lines.

9. The power combiner of claim 6 wherein said power absorber means comprises planar resistor networks which bridge every adjacent pair of unbalanced microstrip lines.

10. The power combiner of claim 2 wherein said waveguide structure has at least an output rectangular waveguide, an E plane waveguide taper, and an oversize waveguide with parallel walls, and wherein said substrate is tapered at one end and said array of fin-line transitions and individual fin-lines are correspondingly tapered so as to fit within said waveguide taper.

11. The power combiner of claim 1 wherein said dielectric substrate has other metallization patterns on both sides which form an array of fin-line transitions from waveguide to plural microstrip lines, each of which is connected to one of said solid state amplifiers.

12. A planar microwave waveguide-microstrip transition to be mounted within a waveguide structure comprising:
a dielectric substrate having metallization patterns on both sides;
one pattern having a plurality of fin-lines each half of which is coupled to a microstrip line with a given characteristic impedance;
the other pattern having a like number of staggered fin-lines which are coupled to a serrated choke and hence to a continuous ground plane; and
power absorber resistance means for absorbing undesired higher order modes.

13. The planar transition of claim 12 wherein both metallization patterns further have balanced microstrip lines which on one side couple said fin-lines to the aforementioned microstrip lines which are unbalanced, and on the other side couple said fin-lines to said serrated coke.

14. A planar microwave waveguide-microstrip transition to be mounted within a waveguide structure comprising:
a tapered dielectric substrate having metallization patterns on both sides;
one pattern having a plurality of tapered fin-lines, each half of which is coupled to a microstrip line with a given characteristic impedance;
the other pattern having a like number of staggered tapered fin-lines which are coupled to a serrated choke and hence to a continuous ground plane; and
power absorber resistance means for absorbing undesired higher order modes.

15. The planar transition of claim 14 wherein said power absorber resistance means comprise a high resistance metallization strip extending from the tip of each tapered fin-line.

16. The planar transition of claim 14 wherein said power absorber resistance means comprises planar resistor networks which bridge every adjacent pair of said microstrip lines.

* * * * *